United States Patent
Hwang et al.

(10) Patent No.: US 7,186,657 B2
(45) Date of Patent: Mar. 6, 2007

(54) METHOD FOR PATTERNING HFO2-CONTAINING DIELECTRIC

(75) Inventors: Jeng-Huey Hwang, Hsin-Chu (TW); Wei-Tsun Shiau, Kao-Hsiung Hsien (TW); Chien-Ting Lin, Hsin-Chu (TW); Jiunn-Ren Hwang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 56 days.

(21) Appl. No.: 11/160,629

(22) Filed: Jun. 30, 2005

(65) Prior Publication Data
US 2006/0019452 A1     Jan. 26, 2006

Related U.S. Application Data

(62) Division of application No. 10/710,581, filed on Jul. 22, 2004, now abandoned.

(51) Int. Cl.
*H01L 21/302* (2006.01)

(52) U.S. Cl. ............. 438/705; 438/149; 438/424; 438/754; 438/756; 438/785; 438/906; 134/1.3

(58) Field of Classification Search .......... 438/149, 438/424, 705, 754, 756, 785, 906; 134/1.3
See application file for complete search history.

(56) References Cited

U.S. PATENT DOCUMENTS

| 6,818,516 | B1 * | 11/2004 | Lo et al. ............ 438/287 |
| 6,919,251 | B2 | 7/2005 | Rotondaro et al. |
| 7,045,073 | B2 * | 5/2006 | Hareland et al. ....... 216/87 |
| 2005/0081781 | A1 | 4/2005 | Lin et al. |
| 2005/0115925 | A1 * | 6/2005 | Paraschiv et al. ....... 216/96 |
| 2005/0118353 | A1 | 6/2005 | Chen et al. |
| 2005/0164511 | A1 | 7/2005 | Chen et al. |

* cited by examiner

*Primary Examiner*—George A. Goudreau
(74) *Attorney, Agent, or Firm*—Winston Hsu

(57) ABSTRACT

A wafer has a trench, a STI layer formed in the trench, an HfO2-containing gate dielectric covering the wafer and the STI layer, a gate electrode formed on the HfO2-containing gate dielectric, and at least a spacer formed beside the gate electrode. The wafer is preheated and a bromine-rich gas plasma is provided to remove portions of the HfO2-containing gate dielectric.

9 Claims, 4 Drawing Sheets

METHOD FOR PATTERNING HFO2-CONTAINING DIELECTRIC

CROSS REFERENCE TO RELATED APPLICATIONS

This application is a divisional of application Ser. No. 10/710,581 filed Jul. 22, 2004 now abandoned.

BACKGROUND OF THE INVENTION

1. Field of the Invention

The invention relates to a method for patterning an HfO2-containing dielectric, and more particularly, to a method for patterning an HfO2-containing gate dielectric without damaging STI positioned on the same wafer.

2. Description of the Prior Art

For realizing the low power MOS transistor at the 65 nm node and beyond, it is necessary to reduce the gate leakage current for thinner gate dielectrics. The introduction of high-k gate material would be advantageous for extending current MOS technology. After several years of work, many research groups are now focusing on hafnium (Hf) based material and are evaluating the natural of these materials extensively. Among the considerable Hf-based materials, HfO2 is often evaluated to be combined into a metal gate structure.

However, HfO2-containing dielectric (including HfO2, HfSiO, HfSiON, HfAlO, and so on) is known for more difficult to be pattern etched comparing to SiO2 based dielectric. The conventional method of etching the HfO2-containing dielectric involves using a strong acid, such as 49% HF solution. When using the 49% HF solution to etch the HfO2-containing dielectric, a SiO2 layer, such as a shallow trench isolation (STI) layer, will be also removed. Furthermore, the etching rate of the SiO2 layer is much higher than that of the HfO2-containing dielectric, and the SiO2 layer will be seriously damaged while patterning the HfO2-containing dielectric.

Another conventional method of etching the HfO2-containing dielectric is using a high insert gas plasma with more than 60% Ar. The insert gas plasma has no selectivity while etching, and may also result in the SiO2 layer being damaged during over-etch.

Please refer to FIGS. 1 and 2, which show a conventional etching process of the HfO2-containing dielectric. An STI layer 18 is formed on a wafer 10, and an HfO2-containing gate dielectric 12 covers the wafer 10 and the STI layer 18. A gate electrode 16 is formed on the HfO2-containing gate dielectric 12, and two spacers 14 are formed beside the gate electrode 16. As shown in FIG. 2, the conventional etching process such as using the strong acid or the insert gas plasma is performed to remove portions of the HfO2-containing gate dielectric 12. The etching selectively between the HfO2-containing gate dielectric 12 and the STI layer 18 is too low to bring serious damages atop the STI layer 18. As a result, the isolation effect of the STI layer 18 is reduced.

SUMMARY OF THE INVENTION

It is therefore a primary objective of the claimed invention to provide a method for patterning the HfO2-containing gate dielectric without damaging the SiO2 layer to solve the above-mentioned problem.

According to the claimed invention, a method for patterning an HfO2-containing gate dielectric comprises providing a wafer having a trench, a STI layer formed in the trench, the HfO2-containing gate dielectric covering the wafer and the STI layer, a gate electrode formed on the HfO2-containing gate dielectric, and at least a spacer formed beside the gate electrode. Following that, the wafer is preheated and a bromine-rich gas plasma is provided to remove portions of the HfO2-containing gate dielectric.

According to the claimed invention, a method for patterning an HfO2-containing gate dielectric comprises providing a wafer having a trench, a STI layer formed in the trench, the HfO2-containing gate dielectric covering the wafer and the STI layer, a gate electrode formed on the HfO2-containing gate dielectric, and at least a spacer formed beside the gate electrode. Following that, a nitrogen ion bombardment is used to convert the exposed HfO2-containing gate dielectric to a Hf3N4 layer. A phosphoric acid is used to remove the Hf3N4 layer.

It is an advantage of the claimed invention that the bromine-rich gas plasma has a high selectivity between the HfO2-containing dielectric and the SiO2 layer, so that the HfO2-containing dielectric can be etched without damaging the SiO2 layer.

It is another advantage of the claimed invention that the nitrogen ion bombardment can convert the HfO2-containing dielectric to the Hf3N4 layer and the phosphoric acid has a high selectivity between the Hf3N4 and SiO2 layers, so that the HfO2-containing dielectric can be etched without damaging the SiO2 layers.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
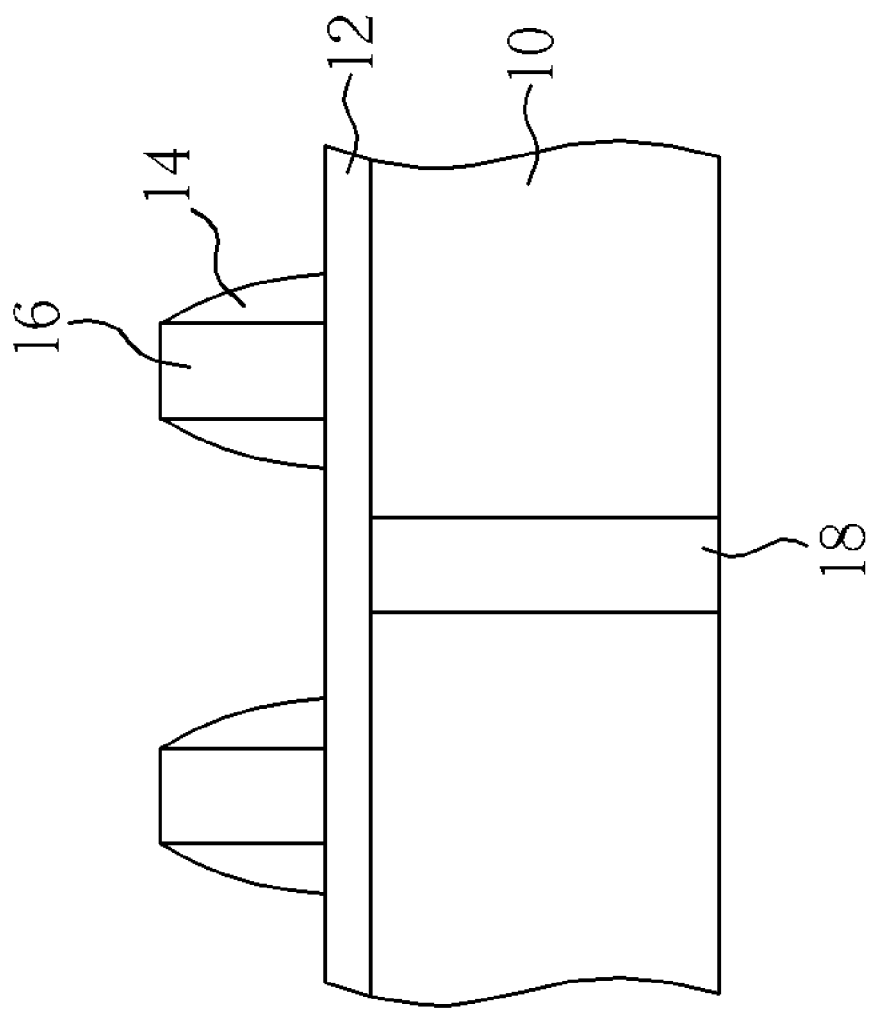
FIG. 1 is a schematic diagram of a wafer before performing a gate dielectric patterning process thereon according to the prior art.
Figure 2:
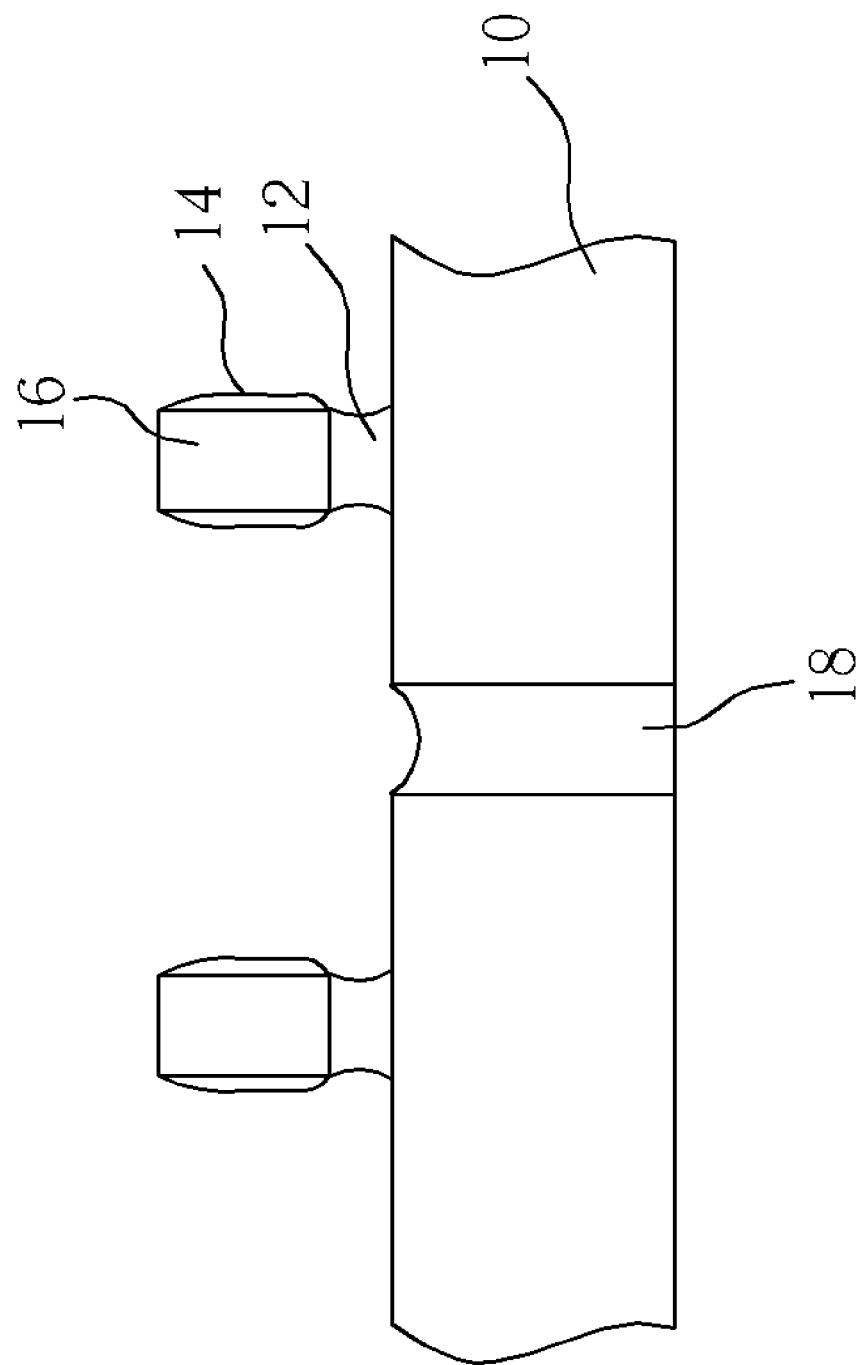
FIG. 2 is a schematic diagram of a wafer after performing a gate dielectric patterning process thereon according to the prior art.
Figure 3:
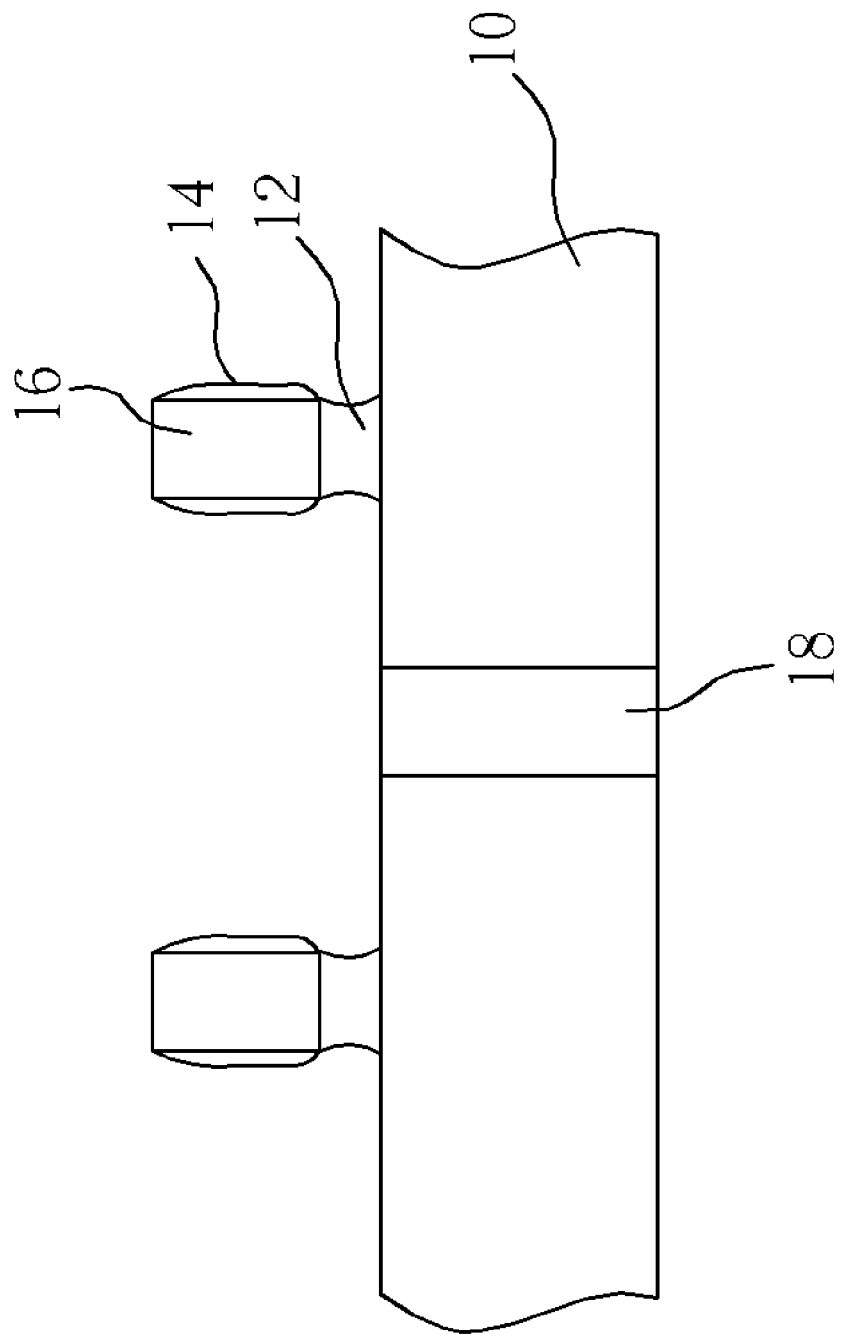
FIG. 3 is a schematic diagram of a wafer after performing a gate dielectric patterning process thereon according to the present invention.

Please refer to FIG. 3, which shows a result of performing a patterning process according to a first embodiment of the present invention. In the first embodiment of the present invention, a bromine-rich gas plasma is utilized to accomplish the requirement of etching the HfO2-containing dielectric with a high selectivity. In this embodiment, a MOS transistor fabrication is used to explain the present invention. Before the etching process, the half-manufactured wafer is similar to that of the prior art as shown in FIG. 1. For example, the STI layer 18 is formed on the wafer 10, and the HfO2-containing gate dielectric 12 covers the wafer 10 and the STI layer 18. The gate electrode 16 is formed on the HfO2-containing gate dielectric 12, and two spacers 14 are formed beside the gate electrode 16. The STI layer 18 and the spacer 14 may be formed of SiO2, and the gate electrode 16 may be formed of TaN or TiN.

Then, the wafer 10 is placed into a reactor and is preheated to 200° C. or over 200° C. The reactor can be any type of plasma reactors, such as the parallel plate, the reactive ion etcher (RIE), the inductively coupled plasma (ICP), or the electron cyclotron resonance etcher (ECR), and the preheating procedure can utilize a lamp tray or a non-reactive gas plasma to preheat the wafer 10.

After the wafer 10 is preheated to 200° C. or over 200° C., the bromine-rich gas plasma is supplied into the reactor to remove portions of the HfO2-containing gate dielectric 12. The bromine-rich gas plasma can be a Br2 plasma, a HBr plasma, or a mixture of a Br2 plasma and a HBr plasma, and concentration of the bromine-rich gas plasma is higher than 30%. On the wafer surface, the bromine-rich gas plasma will react with the HfO2-containing gate dielectric 12 and produce a volatile product HfBr4. At the elevated temperature (≧200° C.), HfBr4 is volatile and can be taken out by the pumping system. After removing portions of the HfO2-containing gate dielectric 12, the STI layer 18 is exposed. Since the bromine-rich gas plasma etches the SiO2 material of the STI layer 18 much slower than the HfO2-containing gate dielectric 12, the STI layer 18 will be almost undamaged. In addition, a sacrifice layer (not shown) can be further formed on the gate electrode 16 before performing the patterning process to protect the gate electrode 16. The sacrifice layer may be formed of SiO2.

Furthermore, in other embodiments of the present invention, additive gases, such as Ar, N2, He, O2, CHF3, etc., can be introduced into the reactor to assist uniform etching of the HfO2-containing gate dielectric 12. It is also worthy of notice that the present invention is not limited to pattern the HfO2-containing gate dielectric. The present invention is also applicable in any etching process relating to pattern HfO2-containing dielectric. For example, a wafer having an HfO2-containing dielectric is provided, and the wafer is preheated to a predetermined temperature. Following that, a bromine-rich gas plasma is provided to remove portions of the HfO2-containing dielectric, thus providing a high etching selectivity in etching HfO2.

Figure 4:
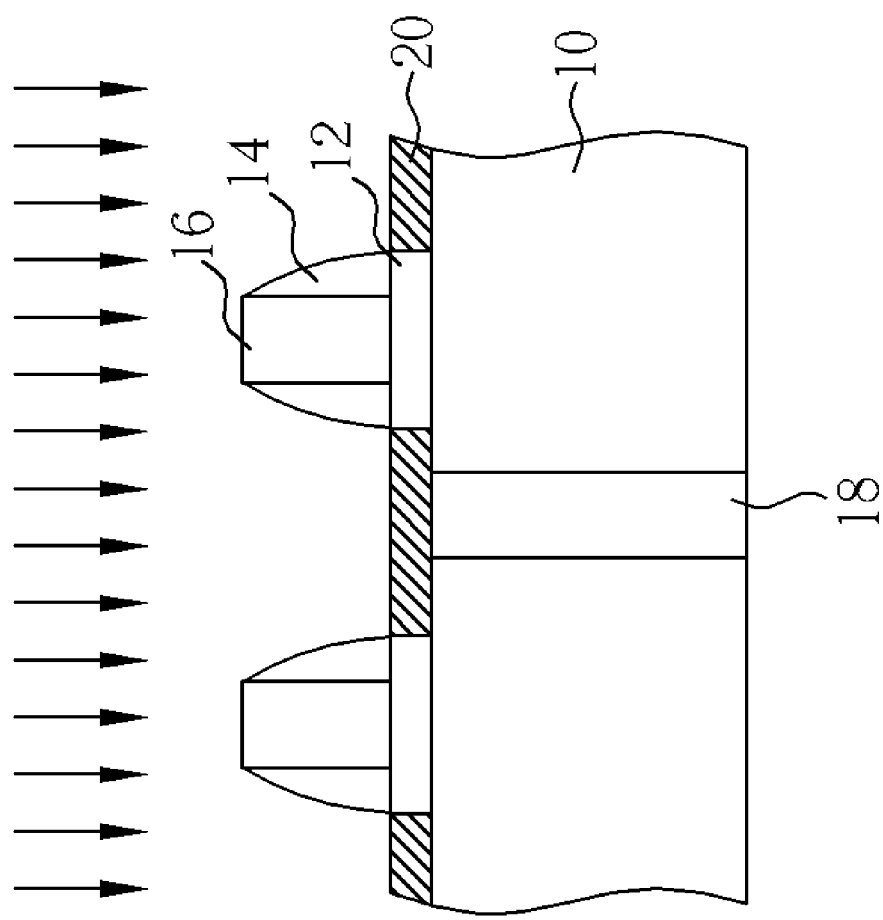
FIG. 4 is a schematic diagram of a wafer after performing a gate dielectric patterning process thereon according to a second embodiment of the present invention.

Another embodiment of the present invention is utilizing a nitrogen ion bombardment to convert the exposed HfO2-containing dielectric to an Hf3N4 (Hafnium Nitride) layer and then utilizing a phosphoric acid to remove the Hf3N4 layer. Please refer to FIG. 4, which shows the patterning process of the second embodiment. A nitrogen ion bombardment is performed on the half-manufactured wafer 10, and the exposed HfO2-containing gate dielectric 12 is converted to an Hf3N4 layer 20. While performing the nitrogen ion bombardment, a nitrogen gas or a nitrogen-contained gas can be used to produce the nitrogen ions. The regions covered by the gate electrode 16 and the spacers 14 are protected and retain the HfO2-containing material. Selectively, a sacrifice layer (not shown) can be also formed on the gate electrode 16 before performing the nitrogen ion bombardment to protect the gate electrode 16.

After the nitrogen ion bombardment, the Hf3N4 layers 20 are formed beside the portion of HfO2-containing gate dielectrics 12 under the gate electrode 16 and the spacers 14. The Hf3N4 layers 20 are easily etched by the phosphoric acid. In this embodiment, a H3PO4 solution is utilized to remove the Hf3N4 layers 20, but the H3PO4 solution etches neither the SiO2 layer nor the Si layer. The STI layers 18 will be almost undamaged after the Hf3N4 layers 20 is removed. In addition, for speeding the removing process, the H3PO4 solution can be maintained at the temperature 50° C.-300° C. It is also worthy of notice that the present invention is not limited to pattern the HfO2-containing gate dielectric. The present invention is also applicable in any etching process relating to pattern HfO2-containing dielectric. For example, a wafer having an HfO2-containing dielectric is provided, and a nitrogen ion bombardment is used to convert portions of the HfO2-containing dielectric to an Hf3N4 layer. Following that, a phosphoric acid is used to remove the Hf3N4 layer, thus providing a high etching selectivity in etching HfO2.

In contrast to the prior art, the present invention has a high etching selectivity between the HfO2-containing material and the SiO2 material, so that the STI layer can be retained complete after the gate dielectric is removed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for patterning an HfO2-containing gate dielectric, the method comprising:
   providing a wafer having a trench, a STI layer formed in the trench, the HfO2-containing gate dielectric covering the wafer and the STI layer, a gate electrode formed on the HfO2-containing gate dielectric, and at least a spacer formed beside the gate electrode;
   performing a nitrogen ion bombardment to convert the exposed HfO2-containing gate dielectric to an Hf3N4 layer; and
   utilizing a phosphoric acid to remove the Hf3N4 layer.

2. The method of claim 1 wherein the STI layer comprises SiO2.

3. The method of claim 1 wherein the spacer comprises SiO2.

4. The method of claim 1 wherein the gate electrode comprises TaN or TiN.

5. The method of claim 1 wherein the method comprises utilizing a nitrogen gas or a nitrogen-contained gas to perform the nitrogen ion bombardment.

6. The method of claim 1 wherein the Hf3N4 layer is removed at temperature between 50° C. and 300° C.

7. A method for etching an HfO2-containing dielectric, the method comprising:
   providing a wafer having the HfO2-containing dielectric;
   performing a nitrogen ion bombardment to convert portions of the HfO2-containing dielectric to an Hf3N4 layer; and
   utilizing a phosphoric acid to remove the Hf3N4 layer.

8. The method of claim 7 wherein the method comprises utilizing a nitrogen gas or a nitrogen-contained gas to perform the nitrogen ion bombardment.

9. The method of claim 7 wherein the Hf3N4 layer is removed at temperature between 50° C. and 300° C.

* * * * *